United States Patent [19]
Parvathala et al.

[11] Patent Number: 5,978,944
[45] Date of Patent: Nov. 2, 1999

[54] METHOD AND APPARATUS FOR SCAN TESTING DYNAMIC CIRCUITS

[75] Inventors: Praveen Parvathala, Phoenix, Ariz.; Fred Gruner, Palo Alto, Calif.

[73] Assignee: Intel Corporation, Santa Clara, Calif.

[21] Appl. No.: 08/979,407

[22] Filed: Nov. 26, 1997

[51] Int. Cl.$^6$ .................................................. G01R 31/28
[52] U.S. Cl. .......................................... 714/726; 714/733
[58] Field of Search ............................. 371/22.31, 22.32, 371/22.35, 22.5, 22.34; 327/202, 199, 200; 326/16, 93; 395/183.06; 714/30, 32, 726, 727, 729, 731, 733, 742, 744; 365/201

[56] References Cited

U.S. PATENT DOCUMENTS

| | | | |
|---|---|---|---|
| 5,220,281 | 6/1993 | Matsuki | 324/158 R |
| 5,513,187 | 4/1996 | Zepp | 371/22.3 |
| 5,606,565 | 2/1997 | Edler et al. | 371/22.3 |
| 5,619,157 | 4/1997 | Kumata et al. | 327/203 |
| 5,619,511 | 4/1997 | Sugisawa et al. | 371/22.3 |
| 5,654,658 | 8/1997 | Kubata et al. | 327/202 |
| 5,751,727 | 5/1998 | Martens | 371/21.1 |

OTHER PUBLICATIONS

PCT Search Report, International Application No.: PCT/US98/17948, mailed Nov. 9, 1998, 4pgs.

*Primary Examiner*—Robert W. Beausoliel, Jr.
*Assistant Examiner*—Nadeem Iqbal
*Attorney, Agent, or Firm*—Blakely, Sokoloff, Taylor & Zafman LLP

[57] ABSTRACT

A method and apparatus comprising a first circuit configured to receive a mode signal and generate a first signal and a second signal, the first circuit being configured to deassert the first signal and the second signal when the mode signal is in a first state; a first scan cell configured to latch a first input in response to the first signal and to latch a second input in response to a third signal to produce a first latched signal on a first output, the first scan cell configured to drive a second output in response to a fourth signal, wherein the second input and the second output are coupled to a scan chain; a dynamic circuit having a dynamic node, the dynamic circuit being configured to receive the first output and the second signal, to precharge the dynamic node in response to the second signal being deasserted, and produce a data on the third output in response to the second signal being asserted and the state of the dynamic node; and a second cell configured to latch the data in response to the second signal being deasserted.

12 Claims, 5 Drawing Sheets

METHOD AND APPARATUS FOR SCAN TESTING DYNAMIC CIRCUITS

BACKGROUND OF THE INVENTION

1. Field of the Invention

The present invention relates to the field of scan testing; more particularly, the present invention relates to a method and apparatus for performing scan testing on dynamic circuits, such as domino logic.

2. Description of Related Art

A typical integrated circuit has combinational logic blocks, which may include dynamic circuits, such as domino logic. These combinational logic blocks are coupled through latches controlled by a system clock. In order to test the functionality and performance of a combinational logic block, various combinations of stimulus conditions are selected according to well-known methods. In order to apply the desired stimulus to a combinational logic block, a sequence of operations may need to be performed. In a complex integrated circuit, the time to apply this sequence of operations can be burdensome.

Scan testing is a well-known technique for implementing a scan chain which serially accepts data that is applied to critical inputs of these combinational logic blocks. The ability to directly control inputs of internal combinational logic simplifies the preparation process for a test of the combinational logic blocks. Each of the scan cells have a scan input latch and a scan output latch that are serially coupled to adjacent scan cells to produce the scan chain. Each of the scan cells also have a functional input latch that is coupled to an output of one combinational logic block and a functional output latch that is coupled to the input of another combinational logic block.

One type of combinational logic block is a domino circuit. During normal operation of a domino circuit, a clock is deasserted to precharge an output node to a high logic level while the output of a first latch (input to the domino circuit) and other inputs to the domino circuit transitions to and stabilizes at the desired logic levels. Then, the clock is asserted to conditionally discharge (evaluate) the output node depending on the inputs to the domino circuit. A second latch is coupled to receive the output of the domino circuit and configured to be transparent while the clock is asserted. When the clock is again deasserted, the second latch is closed such that the output of the domino circuit is stored within the second latch before the output node is again precharged.

The output node is discharged if the input signals to the domino circuit enable a discharge path from the output node to the ground node. The domino circuit is configured such that a discharge path is not enabled when the desired output is a high logic level for a particular combination of input values (permitting the output node to remain at its high logic level established during the precharge phase) and enabled when the desired output is a low logic level for a particular combination of input values.

The following method is used to test the operation of dynamic circuits, such as domino logic, by using scan testing. First, a sequence of bits are applied to the head of the scan chain until all the scan cells have been initialized to the desired values. The stimulus is then applied to the domino logic through a functional output latch and each response is captured by a corresponding functional input latch at an output of the domino circuit. The output of each domino circuit is serially shifted out through the scan output latches to the tail of the scan chain to be compared against expected values. Should a domino circuit not discharge an output node during the time provided or should the domino circuit be defective such that it discharges the output when it should not or does not discharge the output when it should, the response will not correspond to the expected value and the device will fail the test.

During the scan shift operation, the clock may be asserted (indicating an evaluation phase) or deasserted (indicating a precharge phase). Testing dynamic circuits, such as domino logic, under either condition presents problems.

If the clock is left in an asserted state (evaluate phase) during the scan shift operation, the toggling data may trigger a spurious discharge of the output node.

It is important that the inputs to the domino circuit are stable at the desired values when during an evaluation phase in order to avoid generating an incorrect output. If an input signal temporarily transitions through a logic level other than the desired logic level during the scan shift operation performed in the evaluation phase such that the combination of input values at any instant enables a discharge path through the domino circuit, the output may be discharged to the low logic level. The output remains discharged until the next precharge phase even if the input values attain their desired values and these desired values do not enable a discharge path. Thus, even if the desired input values correspond to an output at the high logic level, the spurious discharge causes the output to transition to and remain at the low logic level.

One method to avoid a spurious discharge if the clock is left in the asserted state is to include logic coupled to receive the output of the scan cell and a test mode signal to generate a new output which does not toggle during the scan shift operation. A scan cell which does not toggle during the scan shift operation is known as a non-destructive scan cell. During the scan shift operation, the test mode input is asserted, causing the logic to force the new output to a value which will not cause the combinational logic to discharge the output node. For example, the logic may simply be a nor gate coupled to receive the output signal and a test mode signal to generate a new output being the same as the output signal when the test mode signal is deasserted and a logic low level when the test mode signal is asserted. When the scan shift operation is completed, the test mode input is deasserted, causing the logic to force the new output to the desired value. Although the use of an extra control signal (the test mode signal) and this additional logic avoids the spurious discharge during the scan shift operation, it also requires a more complex scan cell which adds to the cost of the integrated circuit particularly since the scan cells are typically replicated in numerous latches and flip-flops throughout the integrated circuit.

If the clock is left in a deasserted state (precharge phase), the scan latch data stored in that internal node may be corrupted. The first scan latch (functional output latch of a first scan cell) that drives an input of a domino circuit is transparent when the clock is deasserted (precharge phase) and the second scan latch (functional input latch of a second scan cell) that latches the output of the domino circuit is transparent when the clock is asserted (evaluate phase). However, during the scan shift operation, the data is serially scanned through each of these scan cells via a scan input latch and scan output latch (scan latching) as opposed to the functional input latch and functional output latch (functionally latching). If the clock is left in a deasserted state, the functional input latch of the scan cell is enabled during the scan shift operation. Therefore, both the scan input latch and the functional input latch drive the same internal node. Thus, the scan latch data stored in that internal node may be corrupted.

One method to avoid corruption of data if the clock is left in the deasserted state is to add logic to enable control of the scan cell latch such that the scan cell latch is only transparent if the clock is deasserted and a test mode signal is deasserted. During a scan shift operation, the test mode signal is asserted thereby disabling the first scan cell latch despite the deassertion of the clock signal. When the scan shift operation is completed, the clock signal is asserted (evaluate phase) and then the test mode signal is deasserted thereby continuing to disable the first scan cell latch. The output is latched by the second scan cell latch when the clock signal is deasserted. Thus, the critical period begins at the time the clock signal is asserted and ends when the clock signal is deasserted. This method does require an extra control signal (the test mode signal). The additional control signal and logic adds complexity and cost to the integrated circuit.

What is needed is a method and apparatus to perform scan testing of dynamic circuits, such as domino logic, which do not require an additional control signal.

SUMMARY OF THE INVENTION

A method and apparatus comprising a first circuit configured to receive a mode signal and generate a first signal and a second signal, the first circuit being configured to deassert the first signal and the second signal when the mode signal is in a first state; a first scan cell configured to latch a first input in response to the first signal and to latch a second input in response to a third signal to produce a first latched signal on a first output, the first scan cell configured to drive a second output in response to a fourth signal, wherein the second input and the second output are coupled to a scan chain; a dynamic circuit having a dynamic node, the dynamic circuit being configured to receive the first output and the second signal, to precharge the dynamic node in response to the second signal being deasserted, and produce a data on the third output in response to the second signal being asserted and the state of the dynamic node; and a second cell configured to latch the data in response to the second signal being deasserted.

DETAILED DESCRIPTION

The present invention provides the ability to perform scan testing on dynamic circuits, such as domino logic, using destructive scan cells without requiring a control signal that increases circuit complexity and adds to device cost.

In the following detailed description, numerous specific details are set forth in order to provide a thorough understanding of the described invention. Some of these specific details need not be used to practice the invention. In other instances, well-known structures, signals, and methods have not been shown in detail in order not to obscure the described invention.

Figure 1:
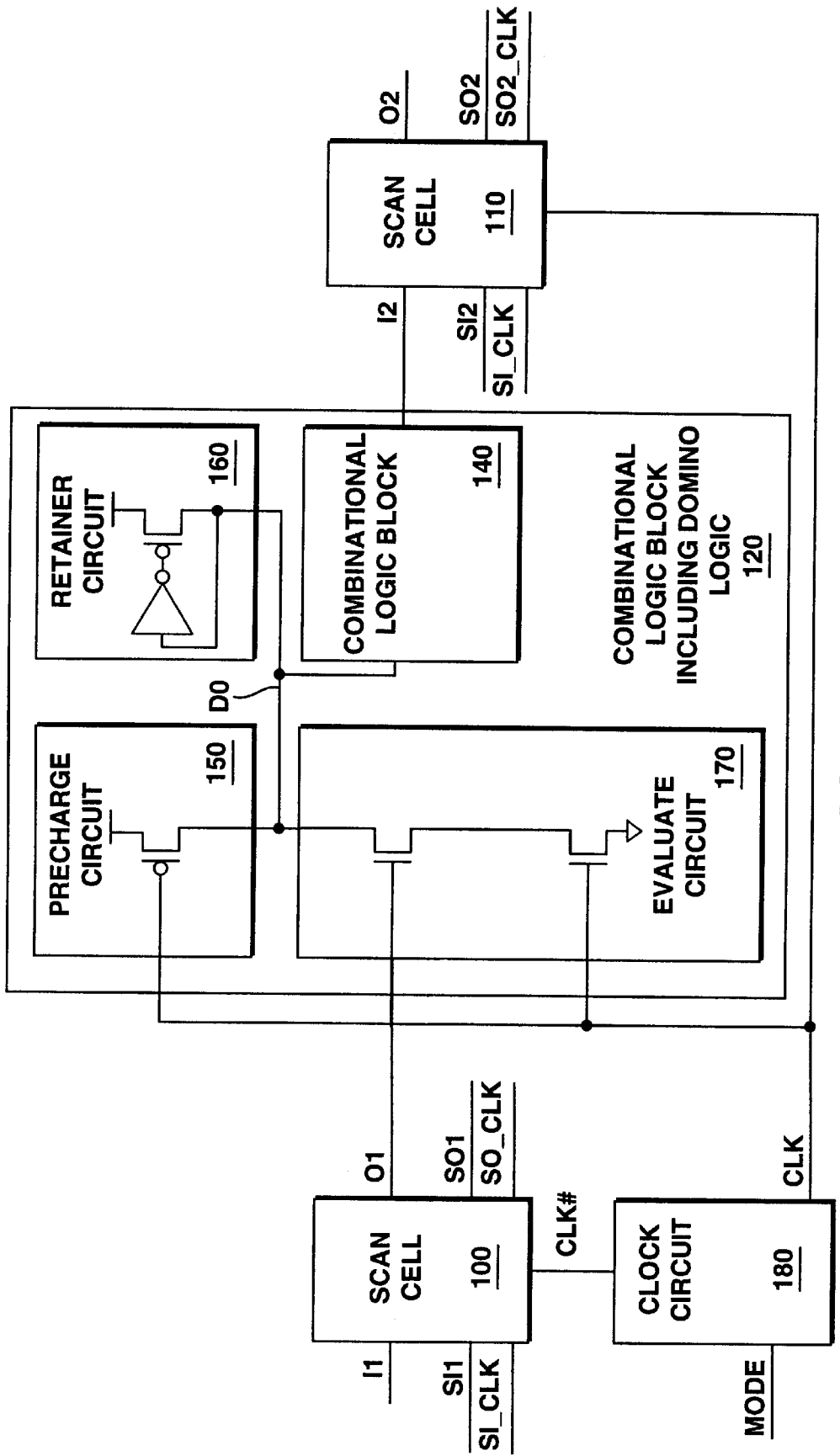
FIG. 1 illustrates one embodiment of an apparatus of the present invention.

FIG. 1 illustrates one embodiment of the apparatus of the present invention.

A scan cell 100 is coupled to latch an I1 signal in response to a CLK# signal and latch an SI1 signal in response to an SI_CLK signal. The I1 signal is received from an output of a stage of logic. The latched signal is driven onto an O1 node to produce an O1 signal. In response to an SO_CLK signal, the latched signal is driven onto an SO1 node to produce an SO1 signal. The SI1, SI_CLK, SO1, and SO_CLK signals are coupled to a scan chain according to well known methods.

Similarly, a scan cell 110 is coupled to latch an I2 signal in response to a CLK signal and latch an SI2 signal in response to the SI_CLK signal. The latched signal is driven onto an O2 node to produce an O2 signal. The O2 signal is coupled to an input of a stage of logic. In response to the SO_CLK signal, the latched signal is driven onto an SO2 node to produce an SO2 signal. The SI2, SI_CLK, SO2, and SO_CLK signals are coupled to a scan chain according to well known methods. In another embodiment, the I2 signal is not coupled directly to a scan cell. Intermediate combinational or sequential logic may exist between the I2 signal and a scan cell.

A combinational logic block including domino logic 120 is coupled to receive the O1 signal from the scan cell 100 and drive the I2 node of the scan cell 110. The O1 signal and the CLK signal is coupled to inputs of an evaluate circuit 170 which is coupled to a D0 node. A precharge circuit 150 is used to precharge the D0 node in response to the CLK signal being deasserted during the precharge phase and a retainer circuit 160 is used to maintain the D0 node during the evaluate phase when the conditional discharge is not performed. The evaluate circuit 170 discharges the D0 node when the O1 signal is asserted during the evaluate phase (when the CLK signal is asserted). If the O1 signal is not asserted during the evaluate phase, the D0 node is not discharged. A combinational logic block 140 is coupled to receive the D0 signal from the D0 node and drive the I2 signal. In one embodiment, the combinational logic block 140 receives other input signals (not shown).

A clock circuit 180 is coupled to receive a mode signal and generate the CLK and CLK# signals accordingly. In a first mode, during a scan shift operation, for example, both the CLK signal and the CLK# signal are deasserted. By deasserting the CLK# signal, the I1 signal of the scan cell 100 is not latched thereby avoiding the corruption of the data scanned through the scan cell 100 during the scan shift operation. By deasserting the CLK signal, the evaluate circuit 170 is disabled thereby preventing a spurious discharge of the D0 signal as the O1 signal toggles during the scan shift operation. In a second mode, during functional operation, for example, the CLK signal and the CLK# signal are alternately asserted to precharge the D0 node (precharge phase) when one signal is asserted and to conditionally discharge the D0 node (evaluate phase) when the other signal is asserted. Dynamic logic corresponding to the CLK signal will be precharged during the assertion of the CLK# signal and evaluate during the assertion of the CLK signal. Dynamic logic corresponding to the CLK# signal will be precharged during the assertion of the CLK signal and evaluate during the assertion of the CLK# signal. Other modes may be implemented.

During scan testing, the clock circuit 180 is operated in the scan shift mode and the scan control signals are applied to scan in the data to be applied to the combinational logic block including domino logic 120. Next, the clock circuit 180 is operated in the functional operation mode and the CLK signal is asserted. When the CLK signal is asserted, the evaluate circuit 170 discharges the D0 node if the O1 signal is asserted. The combinational logic block 140 generates the I2 signal corresponding to the evaluated D0 signal. When the CLK signal is deasserted, the I2 signal is latched by the scan cell 110. The latched values for each scan cell is then shifted through the scan chain for comparison with expected values by applying a sequence of pulses on the SI_CLK and SO_CLK signals.

In another embodiment, the scan cell 100 is coupled to receive the CLK signal instead of the CLK# signal and the combinational logic block including domino logic 120 and the scan cell 110 are coupled to receive the CLK# signal instead of the CLK signal. In this case, the same procedure is used to scan in the data, but the CLK# signal is asserted to enable the conditional discharge of the D0 node and the I2 signal is latched by the scan cell 110 when the CLK# signal is deasserted.

The scan cell 100 illustrated in FIG. 1 does not require additional logic to prevent the O1 signal from toggling during the scan shift operation which would be required if the CLK signal was asserted during the scan shift operation. This simplifies the design and reduces the number of inputs to the integrated circuit. It also reduces the number of pins necessary for test ports that are normally integrated onto system hardware such as motherboards. The reduction of control signals also reduces complexity of scan control logic.

Figure 2:
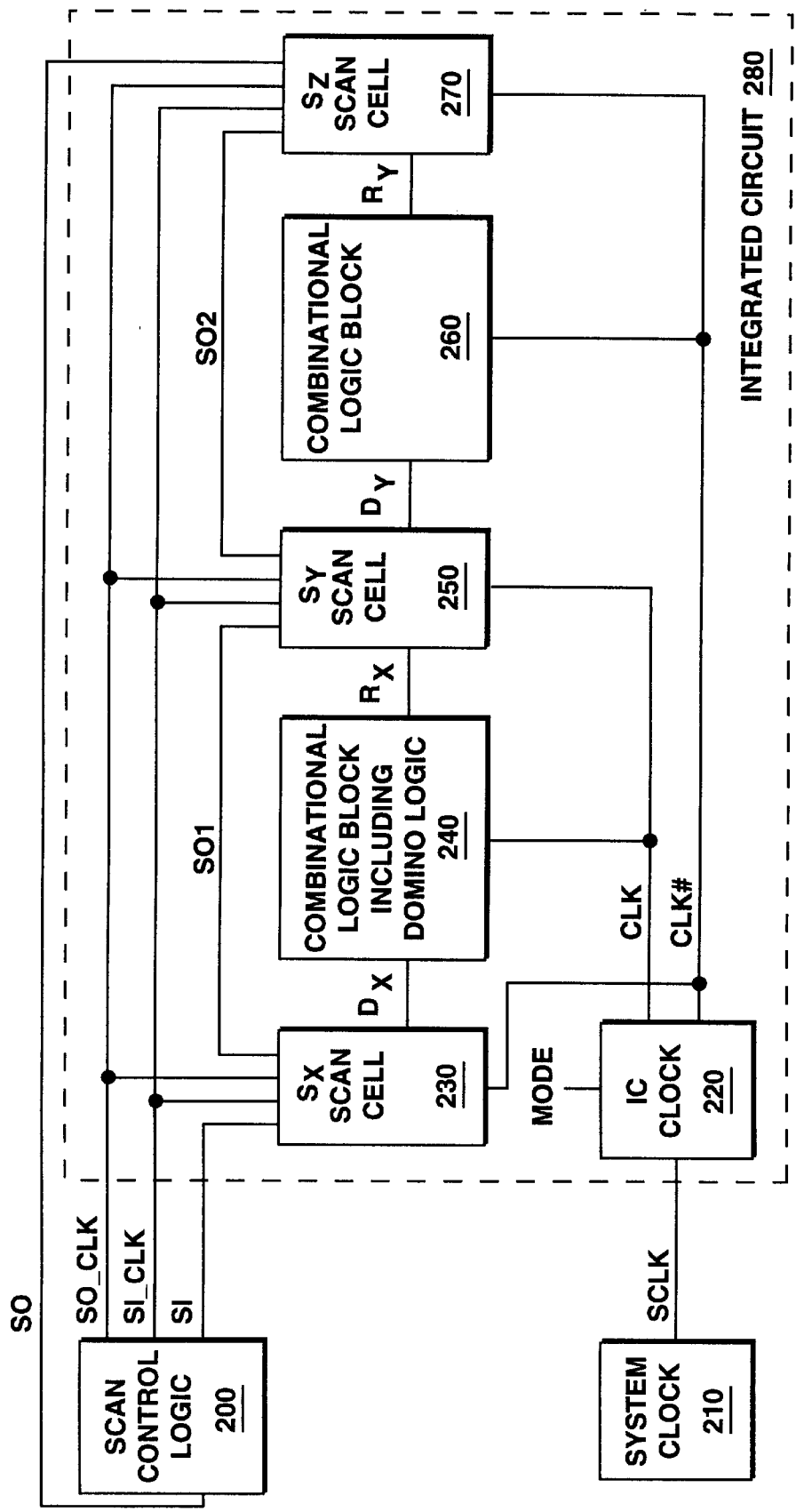
FIG. 2 illustrates one embodiment of system comprising an apparatus of the present invention.

FIG. 2 illustrates a system of the present invention.

A scan control logic 200 is used to generate the SI signal, the SI_CLK signal, and the SO_CLK signal corresponding to scan tests. The scan control logic 200 is also coupled to receive a scan out (SO) signal which is used to capture the response data from the tests for comparison with the expected data. A system clock 210 is used to generate a system clock (SCLK) signal for the system. In one embodiment, some stimulus is applied to the external signals of an integrated circuit 280 to perform the test.

The integrated circuit 280 is coupled to receive the SI signal, the SI_CLK signal, the SO_CLK signal, and the SCLK signal and configured to generate the SO signal. A clock circuit 220 is coupled to receive the SCLK signal and generate the non-overlapping CLK signal and CLK# signal. The clock circuit 220 comprises logic to control the behavior of the CLK and CLK# signals according to a MODE signal. When the mode signal indicates a functional mode, the CLK and CLK# signals are alternately asserted during each cycle such that neither signal is asserted at the same time (non-overlapping). When the MODE signal indicates a scan shift mode, the CLK and CLK# signals are simultaneously deasserted.

A scan cell 230, a scan cell 250, and a scan cell 270 are coupled to receive the SI_CLK signal and the SO_CLK signal. The scan cell 230 is coupled to latch the SI signal from the scan control logic 200 in response to the SI_CLK signal and drive a scan out 1 (SO1) signal in response to the SO_CLK signal. The scan cell 250 is coupled to latch the SO1 signal and in response to the SI_CLK signal and drive a scan out 2 (SO2) signal in response to the SO_CLK signal. The scan cell 270 is coupled to latch the SO2 signal in response to the SI_CLK signal and drive the SO signal in response to the SO_CLK signal. In FIG. 2, a scan chain consisting of three scan cells is used. However, a scan chain typically consists of more scan cells.

The CLK# signal is coupled to the scan cell 230, a combinational logic block 260, and the scan cell 270. The CLK signal is coupled to a combinational logic block including domino logic 240 and the scan cell 250. The output $D_x$ of the scan cell 230 is coupled to an input of the combinational logic block including domino logic 240. The combinational logic block including domino logic 240 also receives other inputs (not shown). The output $R_x$ of the combinational logic block including domino logic 240 is coupled to the input of the scan cell 250. The combinational logic block including domino logic 240 is tested as described herein. The output $D_y$ of the scan cell 250 is coupled to the input of the combinational logic block 260 that generates an output $R_y$ that is latched by the scan cell 270.

In one embodiment, the combinational logic block 260 includes domino logic and is tested as described herein except that the roles of the CLK and CLK# signals are reversed. In another embodiment, the combinational logic block 260 is a static logic block.

Figure 3:
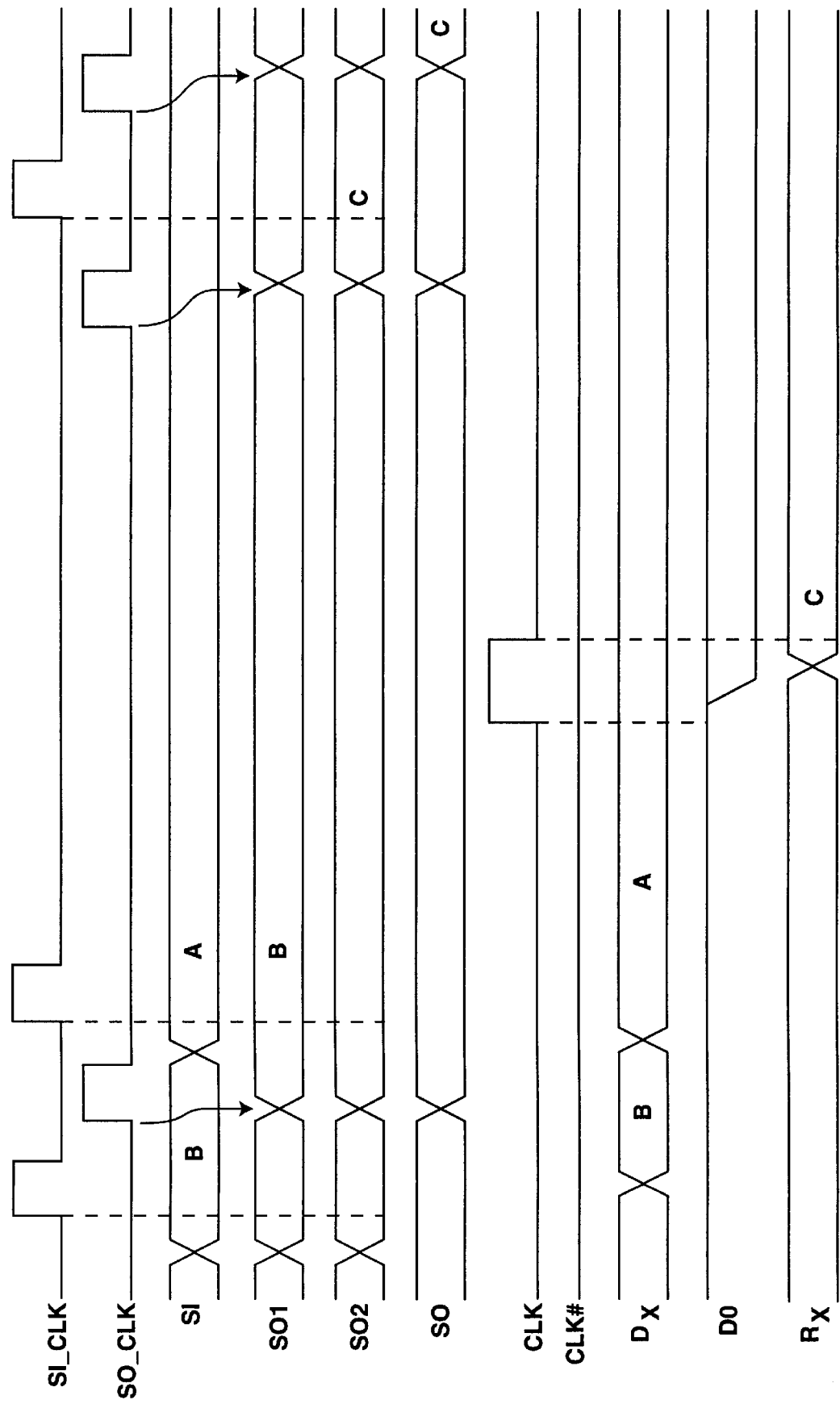
FIG. 3 illustrates one embodiment of a timing diagram of the present invention.

FIG. 3 illustrates a timing diagram of the embodiment of FIG. 2.

The SI_CLK signal is asserted while a first value (indicated by B in the timing diagram) is driven on the SI signal. This causes the scan cell 230 to latch B onto the $D_x$ signal. The SO_CLK signal is asserted to cause the scan cell 230 to drive B onto the SO1 signal. The SI_CLK signal is asserted while a second value (indicated by A in the timing diagram) is driven on the SI signal. This causes the scan cell 230 to latch A onto the $D_x$ signal and the scan cell 250 to latch B onto the $D_y$ signal (not shown). Since the CLK signal is deasserted during the scan shift sequence, the D0 node of the combinational logic block including domino logic 240 is precharged. In one embodiment, a dynamic node in the combinational logic block 260 is precharged in response to the CLK# signal being deasserted.

A pulse of the CLK signal is produced. The CLK signal causes the combinational logic block including domino logic 240 to conditionally discharge (evaluate) the output D0 depending on A. The combinational logic block 140 generates an output $R_x$ (indicated as C on the timing diagram) in response to the input D0. When the CLK signal is deasserted, the scan cell 250 latches C.

C may then be serially scanned out using a sequence of pulses of the SI_CLK signal and SO_CLK signal. The scan cell 250 drives C onto the SO2 signal in response to the assertion of the SO_CLK signal. The scan cell 270 latches C in response to the assertion of the SI_CLK signal. The scan cell 270 drives C on the SO signal in response to the assertion of the SO_CLK signal. C is received by the scan control logic 200 on the SO_CLK signal to be compared against the expected response of the combinational logic block including domino logic 240 to A and any other stimulus applied to the integrated circuit 280.

Figure 4:
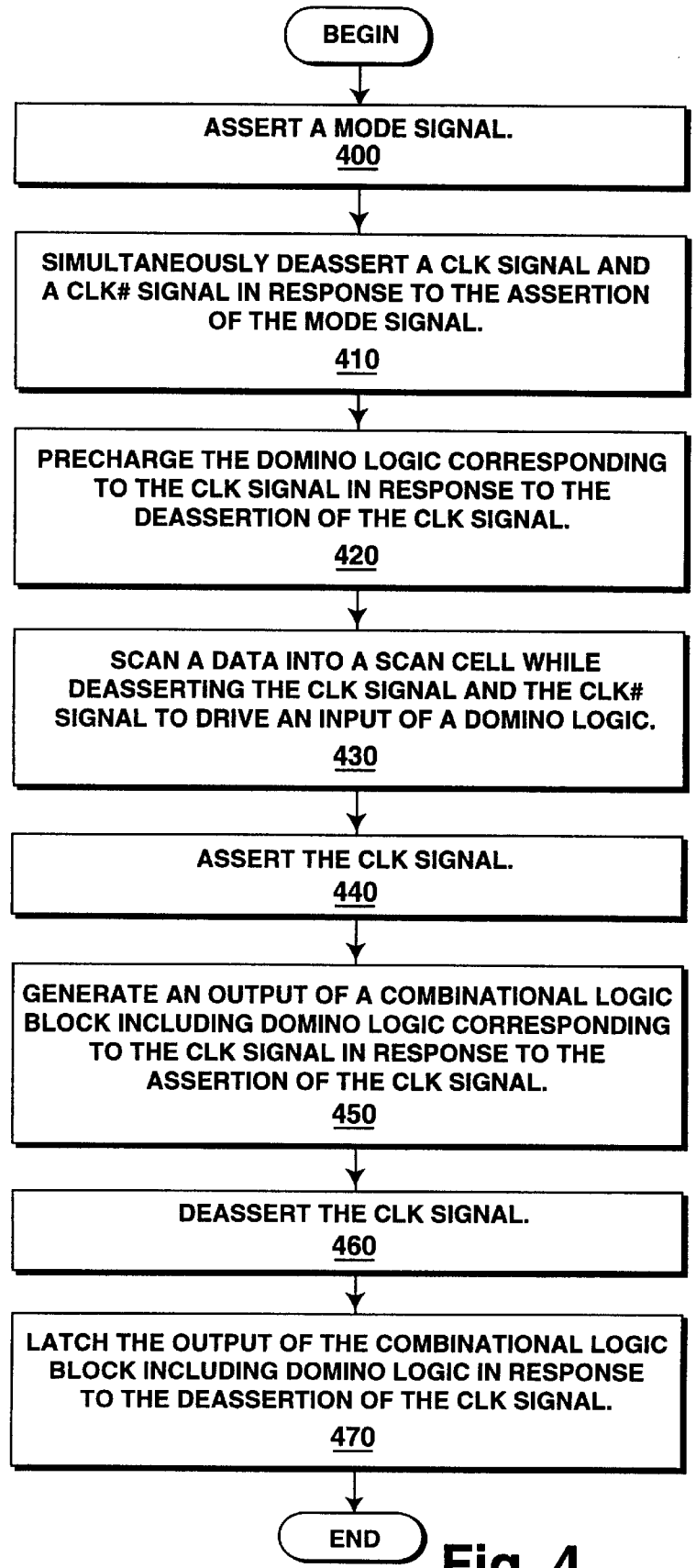
FIG. 4 illustrates one embodiment of a method of testing dynamic circuits.

FIG. 4 illustrates one embodiment of a method of the present invention. In this example, testing of a domino logic corresponding to a CLK signal (evaluated when the CLK signal is asserted) is illustrated. In another embodiment, testing of a domino logic corresponding to the CLK# signal (evaluated when the CLK# signal is asserted) is performed.

In step 400, assert a MODE signal. The MODE signal is asserted when the device is in scan shift mode.

In step 410, simultaneously deassert a CLK signal and a CLK# signal in response to the assertion of the MODE signal. During typical functional operation (MODE signal deasserted), the CLK signal and the CLK# signal are alternately asserted such that either the CLK signal or the CLK# signal is asserted in each cycle.

In step 420, precharge the domino logic corresponding to the CLK signal in response to the deassertion of the CLK signal. In one embodiment, the combinational logic block corresponding to the CLK# signal contains dynamic logic and this dynamic logic is precharged in response to the deassertion of the CLK# signal.

In step 430, scan a data into a scan cell while deasserting the CLK signal and the CLK# signal to drive at least one input of a domino logic. As described herein, there are problems associated with asserting either the CLK signal or the CLK# signal during a scan shift operation when testing a dynamic circuit, such as domino logic. As described herein, the toggling data may trigger a spurious discharge of the dynamic circuit and the scan latch data stored in that internal node may be corrupted. By deasserting both the CLK signal and the CLK# signal simultaneously, these problems are avoided. After the scan shift operation is completed, the data is driven to the input of the domino logic.

In step 440, assert the CLK signal.

In step 450, generate an output of a combinational logic block including domino logic corresponding to the CLK signal in response to the assertion of the CLK signal. The dynamic node of the domino logic is conditionally discharged. The combinational logic block containing the domino logic generates an output signal in response to the conditionally discharged dynamic node of the domino logic and any other inputs to that combinational logic block.

In step 460, deassert the CLK signal.

In step 470, latch the output of the combinational logic block including domino logic in response to the deassertion of the CLK signal.

In one embodiment, the latched output is serially scan shifted out of the device to be compared against the expected response. In another embodiment, the latched output is propagated through combinational or sequential logic and an output of the combinational or sequential logic is serially scan shifted out of the device to be compared against the expected response. Alternatively, the device may be functionally operated to observe other device behavior dependent on the latched output.

Figure 5:
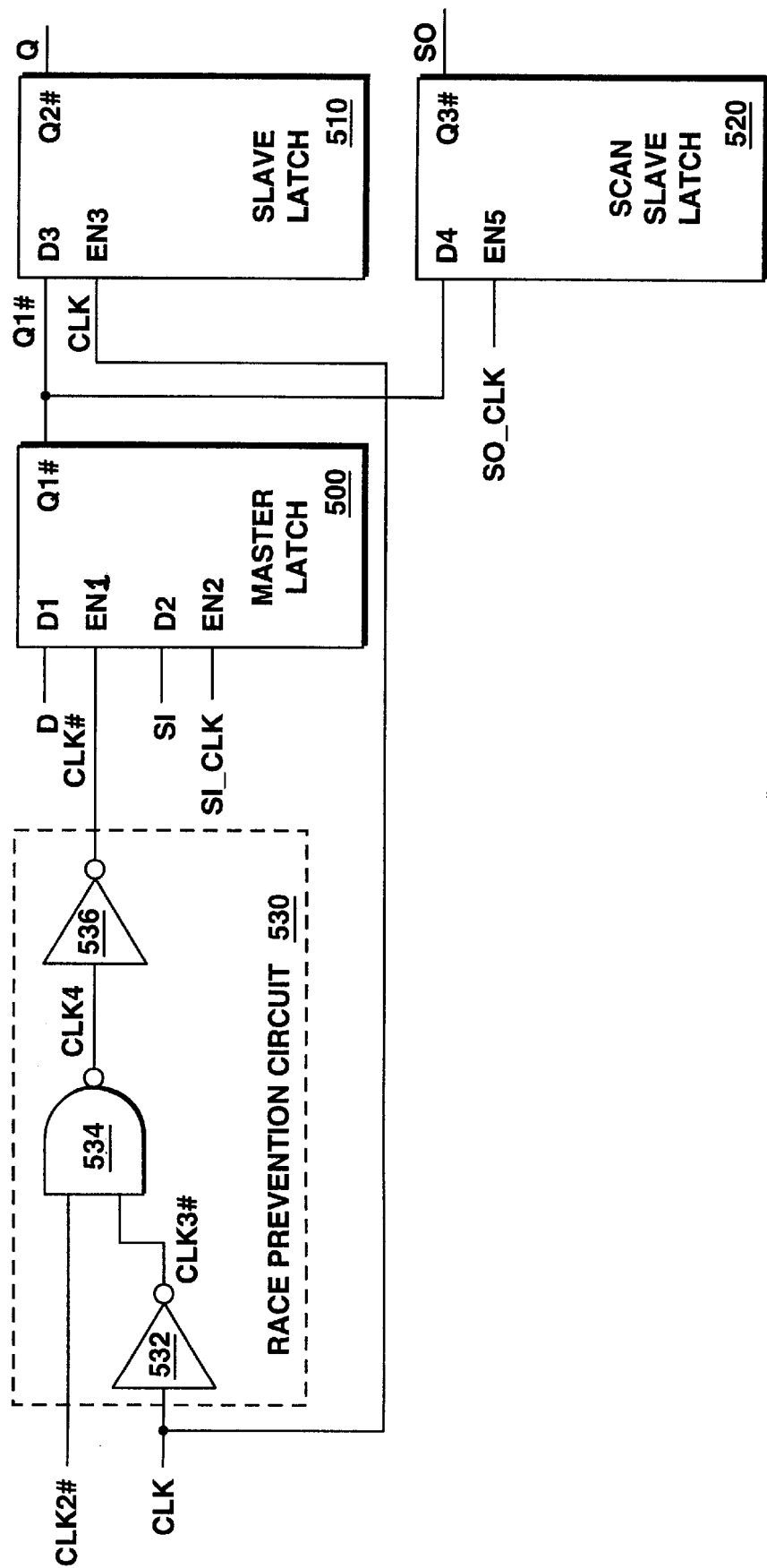
FIG. 5 illustrates one embodiment of a flip flop that is compatible with the apparatus and method of the present invention.

FIG. 5 illustrates one embodiment of a flip flop that is compatible with the apparatus and method of the present invention. In one embodiment, the apparatus and method of the present invention employs flip flops and latches.

A master latch 500 is coupled to receive a data (D) signal which is an output from a first combinational logic block. The D signal is latched in response to the CLK# signal. The master latch 500 is also coupled to receive a scan-in (SI) signal which is strobed in response to the SI_CLK signal. The output (Q1#) signal is the complement of the latched D or SI signal.

A slave latch 510 is coupled to latch the Q1# signal in response to the CLK signal. The slave latch 510 generates a latched signal (Q) that is the complement of the latched Q1# signal. The Q signal is coupled to an signal of a second combinational block. Since the D and SI signals are complemented by the master latch 500 and then complemented by the slave latch 510, the resulting signal is the D or SI signal and not their complement.

A scan slave latch 520 is coupled to latch the Q1# signal in response to the SO_CLK. The scan slave latch 520 drives the latched data to generate a SO signal. The D signal that is latched by the master latch 500 and then by the slave latch 510 is not complemented. The SI signal that is latched by the master latch 500 and then by the scan slave latch 520 is also not complemented. Therefore, when the response data is serially scanned out for comparison with the expected response, external logic that is used to analyze the scan results tests for the expected combinational logic block outputs not its complement as in the prior art example.

During normal functional operation, the SI_CLK and the SO_CLK signals are deasserted. An output of the first combinational logic block is latched by the master latch 500 to generate the Q1# signal in response to the CLK# signal being asserted. The Q1# signal is latched by the slave latch 510 to generate the Q signal in response to the CLK signal being asserted. The Q signal is applied to an input of the second combinational logic block. Therefore, in the normal functional mode of operation, an output of the first combinational logic block is driven to an input of the second combinational logic block in response to the CLK# and CLK signals being asserted in sequence.

During stuck at fault testing, a sequence of alternating pulses of the SI_CLK and the SO_CLK signals are used to serially shift the initial values on the SI signal through the master latch 500 and the scan slave latch 520. During initialization for stuck at fault testing, the CLK and CLK# signals are both deasserted. Note that as the values serially shift through the master latch 500 and the scan slave latch 520, the Q signal (which is the input to the second combinational logic block) is not affected. When the scan is complete the test data is applied to the input of the second combinational logic block by applying a pulse of the CLK signal. By applying a pulse of the CLK# signal, the master latch of another scan cell samples the output of the second combinational logic block. The sampled values for each scan cell is then shifted through the scan chain for comparison with expected values by applying a sequence of pulses on the SI_CLK and SO_CLK signals.

During delay fault testing, a sequence of alternating pulses of the SI_CLK and the SO_CLK signals are used to serially shift in the initial values on the SI signal through the master latch 500 and the scan slave latch 520. During initialization for delay fault testing, the CLK and CLK# signals are both deasserted except to load the initial value into the slave latch 510 as described below. A pulse of the CLK signal is applied to cause the slave latch 510 to latch the initial value onto the Q signal. Then another sequence of alternating pulses of the SI_CLK and the SO_CLK signals are used to serially shift in the final values on the SI signal through the master latch 500 and the scan slave latch 520 to define a transition (from initial value to final value) which is to be applied to the second combination logic block. As in the case of stuck at fault testing, as the values serially shift through the slave latch 510, the Q signal (which is the input to the second combinational logic block) remains constant. When the scan is complete the transition is applied to the input of the second combinational logic block in response to a first pulse of the CLK signal. The master latch of another scan cell samples the output of the second combinational logic block in response to the CLK# signal. The sampled values for each scan cell is then shifted through the scan chain for comparison with expected values. The time between the first and second pulses of the system clock is gradually reduced until the device does not produce the expected values. The last passing time corresponds to the maximum frequency of operation for that test stimulus.

The CLK and CLK# signals are non-overlapping independently controlled clock signals. Preferably, a race prevention circuit 530 is coupled to receive the CLK signal and a CLK2# signal which are not necessarily non-overlapping to produce a CLK signal and CLK# signal that is non-overlapping. A race condition occurs when two sequential latches are enabled simultaneously, thereby allowing an input signal to "race" through two latches in a single clock cycle and cause corruption of data. In one embodiment, a logical inverter 532 is coupled to receive the CLK signal and generate a CLK3# signal. A logical NAND gate 534 is coupled to receive the CLK2# signal and the CLK3# signal to produce a CLK4 signal. An inverter 536 is coupled to receive the CLK4 signal to produce the CLK# signal. If the CLK2# signal and the CLK signal is asserted simultaneously, the CLK signal disables the assertion of the CLK# signal in response to the CLK2# signal. The CLK signal and CLK# signal must be independently controlled so that both can be continuously deasserted at the same time during stuck at and delay fault testing. During normal operation, CLK and CLK# signals are alternately asserted. In one embodiment, there is a period of time between each assertion of the clock signals in which neither clock is asserted. In another embodiment, one of the two clock signals is always asserted during normal operation.

The scan cell illustrated in FIG. 5 does not require additional control signals. The reduction of signals required to perform internal scan testing reduces the number of signals that need to be routed to each scan cell and, if timing sensitive signals are eliminated, it reduces the number of signals that need to be synchronized. The reduction of control signals reduces complexity and area of scan control logic.

Furthermore, by eliminating timing sensitive signals such as the DS control signal of the prior art example, design of the integrated circuit is simplified and the cost (area) is reduced. Also, since the output to the combinational logic does not transition while the serial scan operation is being performed, bus contention issues are avoided.

In addition, by permitting the initial value and the final value to be independently loaded into each scan cell, the dependency between transitions of different scan cells is eliminated. Thus, all combinations of transitions may be generated.

What is claimed is:

1. An apparatus comprising:
   a first circuit configured to receive a mode signal and to generate a first signal and a second signal, the first circuit being configured to deassert the first signal and the second signal when the mode signal is in a first state;
   a first scan cell configured to latch a first input in response to the first signal and to latch a second input in response to a third signal to produce a first latched signal on a first output, the first scan cell configured to drive a second output in response to a fourth signal;
   a dynamic circuit having a dynamic node, the dynamic circuit being configured to receive the first output and the second signal, to precharge the dynamic node in response to the second signal being deasserted, and produce a data on the third output in response to the second signal being asserted; and
   a second cell configured to latch the data in response to the second signal being deasserted.

2. The apparatus of claim 1 wherein the first scan cell is a destructive scan cell.

3. The apparatus of claim 1 wherein the first circuit is configured to alternately assert the first signal when the mode signal is in a second state.

4. The apparatus of claim 1 wherein the second cell is a scan cell configured to latch a third input in response to the third signal, the first data or the third input being latched to produce a second latched signal on a fourth output, the second scan cell being configured to drive a fifth output in response to the fourth signal, wherein the second input, the second output, the third input and the fifth output are coupled to a scan chain.

5. The apparatus of claim 1 wherein the dynamic circuit comprises:
   a precharge circuit configured to receive the second signal, the precharge circuit charging the dynamic node in response to the second signal;
   an evaluate circuit coupled to the first output and the second signal, the evaluate circuit discharging the dynamic node in response to the first output and the second signal; and
   a combinational logic block configured to produce a data on the third output in response to the second signal being asserted.

6. A system comprising:
   a clock circuit driving a clock signal;
   a first circuit configured to receive the clock signal and a mode signal and generate a first signal and a second signal, the first circuit being configured to deassert the first signal and the second signal when the mode signal is in a first state;
   a first scan cell configured to latch a first input in response to the first signal and to latch a second input in response to a third signal to produce a first latched signal on a first output, the first scan cell configured to drive a second output in response to a fourth signal;
   a dynamic circuit having a dynamic node, the dynamic circuit being configured to receive the first output and the second signal, to precharge the dynamic node in response to the second signal being deasserted, and produce a data on the third output in response to the second signal being asserted; and
   a second cell configured to latch the data in response to the second signal being deasserted.

7. The system of claim 6 wherein the first scan cell is a destructive scan cell.

8. The system of claim 6 wherein the first circuit is configured to alternately assert the first signal and the second signal when the mode signal is in a second state.

9. The system of claim 6 wherein the second cell is a scan cell configured to latch a third input in response to the third signal, the first data or the third input being latched to produce a second latched signal on a fourth output, the second scan cell being configured to drive a fifth output in response to the fourth signal, wherein the second input, the second output, the third input and the fifth output are coupled to a scan chain.

10. The system of claim 6 wherein the dynamic circuit comprises:
   a precharge circuit configured to receive the second signal, the precharge circuit charging the dynamic node in response to the second signal;

an evaluate circuit coupled to the first output and the second signal, the evaluate circuit discharging the dynamic node in response to the first output and the second signal; and a combinational logic block configured to produce a data on the third output in response to the second signal being asserted.

11. A method of scan testing a dynamic circuit comprising the steps of:

asserting a mode signal;

simultaneously deasserting a first signal and a second signal in response to the mode signal;

precharging the dynamic circuit in response to the first signal being deasserted;

scanning data into a first scan cell while deasserting a first signal and a second signal;

asserting the first signal;

evaluating a dynamic circuit to produce a data in response to the first signal being asserted;

deasserting the first signal; and latching the data in response to the first signal being deasserted.

12. The method of claim 11 further comprising the step of scanning the data out.

* * * * *